(12) United States Patent
Okamoto (10) Patent No.: US 9,379,087 B2
(45) Date of Patent: Jun. 28, 2016

(54) METHOD OF MAKING A QFN PACKAGE

(71) Applicant: Texas Instruments Incorporated, Dallas, TX (US)

(72) Inventor: Dan Okamoto, Oita (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 15 days.

(21) Appl. No.: 14/535,939

(22) Filed: Nov. 7, 2014

(65) Prior Publication Data

US 2016/0133599 A1  May 12, 2016

(51) Int. Cl.
| | |
|---|---|
| H01L 23/00 | (2006.01) |
| H01L 23/495 | (2006.01) |
| H01L 23/31 | (2006.01) |
| G03F 7/20 | (2006.01) |

(52) U.S. Cl.
CPC ............ *H01L 24/96* (2013.01); *G03F 7/20* (2013.01); *H01L 23/3114* (2013.01); *H01L 23/495* (2013.01)

(58) Field of Classification Search
None
See application file for complete search history.

(56) References Cited

U.S. PATENT DOCUMENTS

| | | | | |
|---|---|---|---|---|
| 2003/0042581 A1* | 3/2003 | Fee et al. | ............... | H01L 21/56 257/666 |
| 2003/0045032 A1* | 3/2003 | Abe | ...................... | H01L 24/97 438/123 |
| 2006/0035414 A1* | 2/2006 | Park | ..................... | H01L 21/561 438/124 |
| 2007/0111374 A1* | 5/2007 | Islam | ................. | H01L 21/4832 438/106 |
| 2012/0313131 A1* | 12/2012 | Oda | .................... | H01L 21/6835 257/98 |
| 2013/0307000 A1* | 11/2013 | Ikenaga | ............... | H01L 33/486 257/91 |
| 2014/0312484 A1* | 10/2014 | Magni | .................... | H01L 23/34 257/706 |

OTHER PUBLICATIONS

Okamoto, Dan; Sada, Hiroyuki; U.S. Appl. No. 14/301,942, filed Jun. 11, 2014 for "Quad Flat No Lead Package and Method of Making," 24 pages.

* cited by examiner

*Primary Examiner* — Michael Jung
(74) *Attorney, Agent, or Firm* — Steven A. Shaw; Frank D. Cimino (57) ABSTRACT

A method of making a flat no lead package including attaching a first plurality of leads in spaced apart relationship in a predetermined pattern on a tape and attaching a first die to the tape at a predetermined position within the predetermined lead pattern.

3 Claims, 11 Drawing Sheets

METHOD OF MAKING A QFN PACKAGE

This application is related to U.S. patent application Ser. No. 14/301,942, filed Jun. 11, 2014, entitled QUAD FLAT NO LEAD PACKAGE AND METHOD OF MAKING of Okamoto, et al., which is hereby incorporated by reference for all that it discloses.

BACKGROUND

Accompanying the popularization of cell phones, notebook personal computers, and other small electronic devices has been a great demand to reduce the size and thickness of the semiconductor devices carried in them. Together with BGA (Ball Grid Array) packages and SON (Small Outline Non-leaded) packages, QFN (Quad Flat No lead) packages have become a popular configuration for small integrated circuit ("IC") packages with leadframes.

In QFN package formation, a leadframe strip containing multiple connected leadframes has multiple semiconductor dies mounted on it. This assembly is sealed with mold compound resins. The sealed assembly is diced (singulated) to form individual QFN packages. During dicing, a saw with a rotating blade, is moved along preset cutting lines across the sealed assembly. Both mold compound and leadframe metal are cut in the dicing process.

SUMMARY

A method of making a plated leadframe comprises forming a first film layer on a first side of a metal plate; forming a second film layer on a second side of the metal plate opposite the first side; and etching the first film layer in a predetermined pattern that exposes portions of the first side of the metal plate.

A QFN comprises an encapsulant block having opposite top and bottom surfaces and a plurality of side surfaces, wherein only the bottom surface comprises exposed metal surfaces.

BRIEF DESCRIPTION OF THE DRAWINGS

FIG. 10 is a cross-sectional side elevation view of the assembly FIG. 9 after removal of a second film layer there from.

DETAILED DESCRIPTION

FIGS. 1-20 schematically illustrate various stages in the formation of a leadless integrated circuit package, such as, for example, a QFN (Quad Flat No Lead integrated circuit package).

Figure 1:
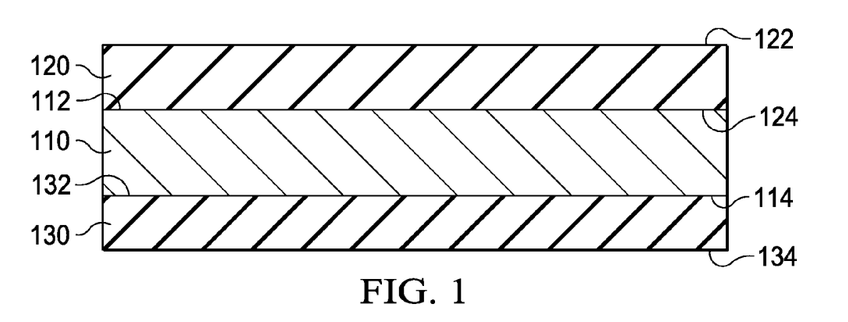
FIG. 1 is a schematic side elevation view of a first assembly created in an initial stage of integrated circuit ("IC") package formation.

FIG. 1 is a schematic side elevation view of a first assembly created in an initial stage of integrated circuit package formation. A metal plate 110 has a first dry film 120 and a second dry film 130 laminated to it. The metal plate 110 may be, for example, a thin, e.g. 200 um (100 um~500 um) copper, gold or aluminum plate 110, from which leads of a leadframe are to be formed. The dry film layers may be thin, for example 25 um, and the films may be made from, for example, binder polymer (acrylic or styrene), monomer and photoinitiator. The film layers may be laminated to the metal layer by conventional lamination processes. The metal plate 110 has a first side 112 and an opposite second side 114. The first dry film layer 120 having a first side 122 and an opposite second side 124 is laminated to the plate 110, with the second side 124 of the first dry film layer 120 in contact with the first side 112 of the plate 110. The second dry film 130 has a first side 132 and an opposite second side 134, with the first side 132 of the second film layer engaging the second side 114 of the metal plate 110.

Figure 2:
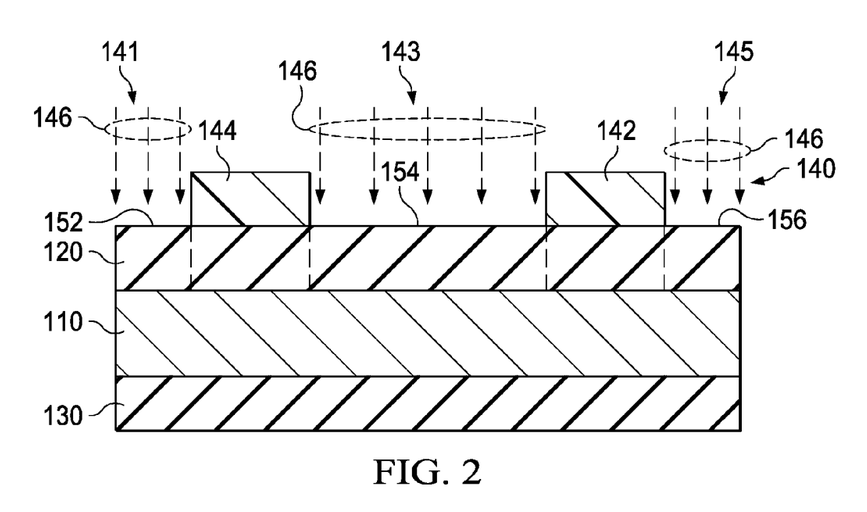
FIG. 2 is a side elevation view of the assembly of FIG. 1 showing a photo-mask applied thereto.

In FIG. 2, a photo-mask 140 having opaque portions 142, 144 is positioned over the first film layer 120. Light 146 is applied to the first film layer 120 through openings 141, 143, 145, etc. in the mask 140 to photo etch exposed portions 152, 154, 156 of the first film layer 120.

Figure 3:
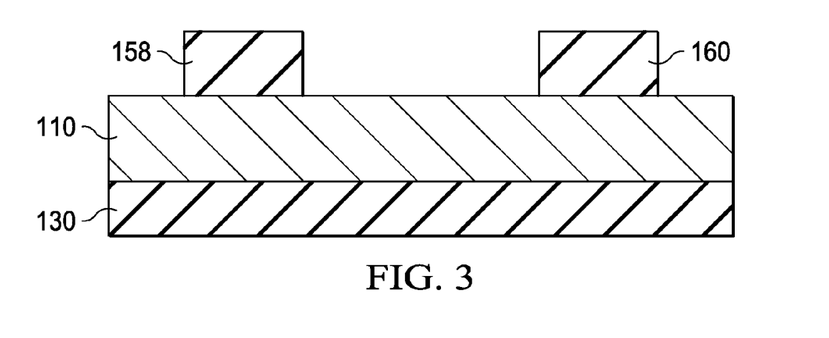
FIG. 3 is a side elevation view of the assembly of FIG. 2 after photo etching.

FIG. 3 illustrates the assembly of FIG. 2 after photo-etching. Only portions 158 and 160 of the first dry film layer 120 remain.

Figure 4:
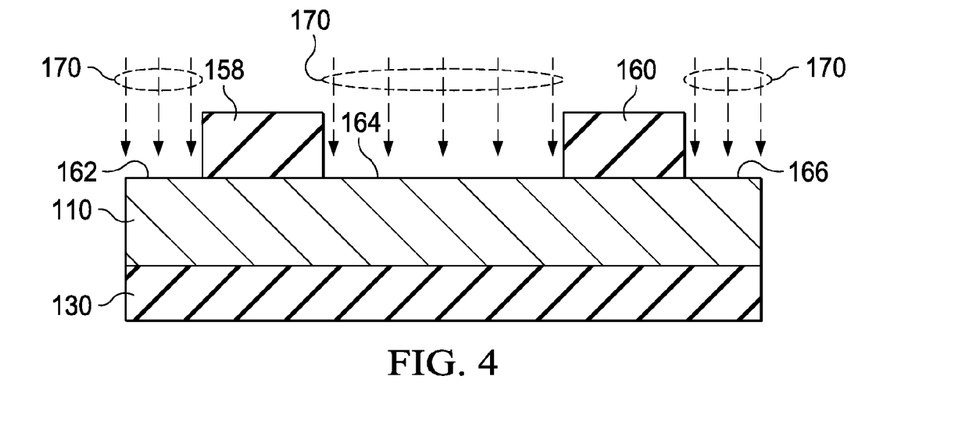
FIG. 4 is a side elevation view of the assembly of FIG. 3 showing chemical etching of a metal layer.

FIG. 4 illustrates etching of the metal plate 110 through open portions 162, 164, 166 with etching chemicals 170.

Figure 5:
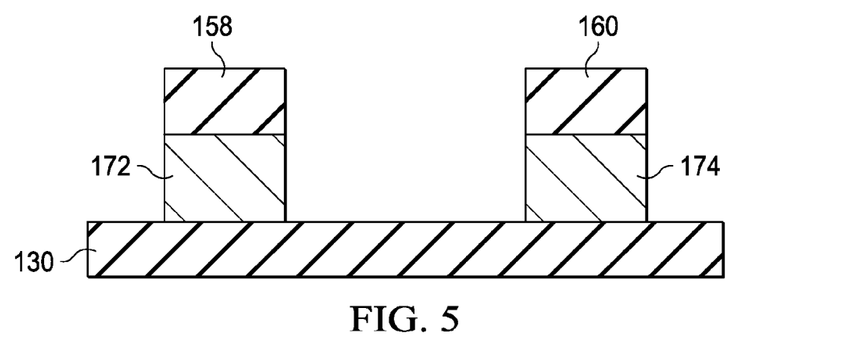
FIG. 5 is a side elevation view of the assembly of FIG. 4 after chemical etching.

FIG. 5 illustrates the assembly of FIG. 4 after chemical etching. All portions of the metal plate 110, FIG. 1, have been etched away except for portions 172 and 174 positioned beneath first film layer portions 158, 160.

Figure 6:
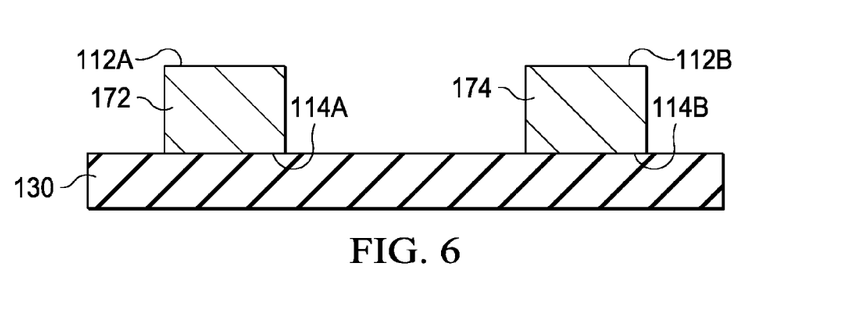
FIG. 6 is a side elevation view of the assembly FIG. 5 after removal of portions of a first film layer.

FIG. 6 illustrates the assembly of FIG. 4 after removal of first film layer portions 158, 160, as by use of conventional film stripping processes. As illustrated by FIG. 6, after removal of the first film layer portions 158, 160, the only portions of the original assembly that remain are the second dry film layer 130 and metal sheet 110 portions 172, 174, which are now referred to as leads 172, 174. The metal portions or leads 172, 174 have first sides 112A and 112B, respectively, corresponding to the first side 112 of the metal plate 110, FIG. 1. The leads 172 and 174 have bottom sides 114A and 114B, respectively, corresponding to the second side 114 of the metal plate 110.

Figure 7:
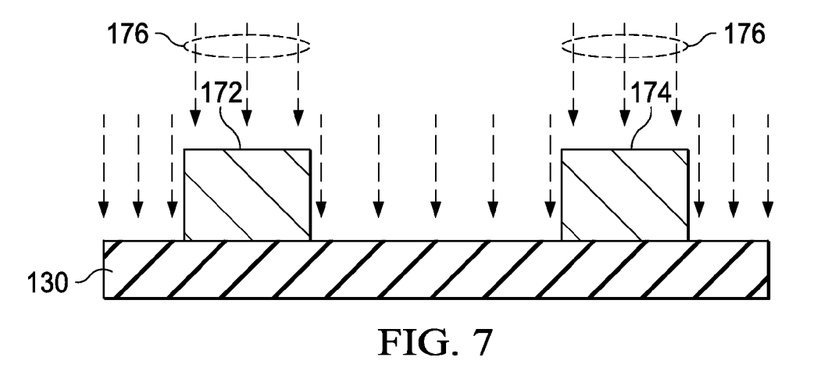
FIG. 7 is a cross-sectional side elevation view of the assembly FIG. 6 showing metal plating of remaining metal portions thereof.
Figure 8:
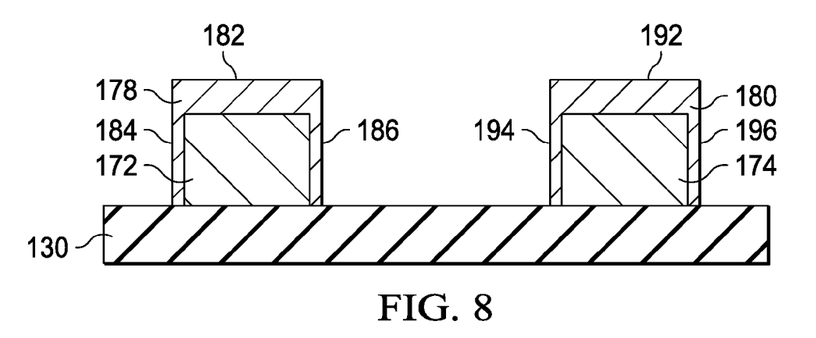
FIG. 8 is a cross-sectional side elevation view of the assembly of FIG. 7 after metal plating.

As illustrated by FIG. 7, the lead portions of the assembly of FIG. 6 are plated with plating material 176, for example with nickel, lead, gold or some combination thereof. This plating may be performed by conventional plating process, such as by electrolytic Ni/Pd/Au plating or electrolytic tin plating FIG. 8 shows the second film layer 130 with leads 172, 174 having plating layers 178, 180 applied thereto. The plating layer 178 has a (top) surface 182 and two lateral side surfaces 184, 186. The plating layer 180 has a (top) surface 192 and lateral side surfaces 194, 196.

Figure 9:
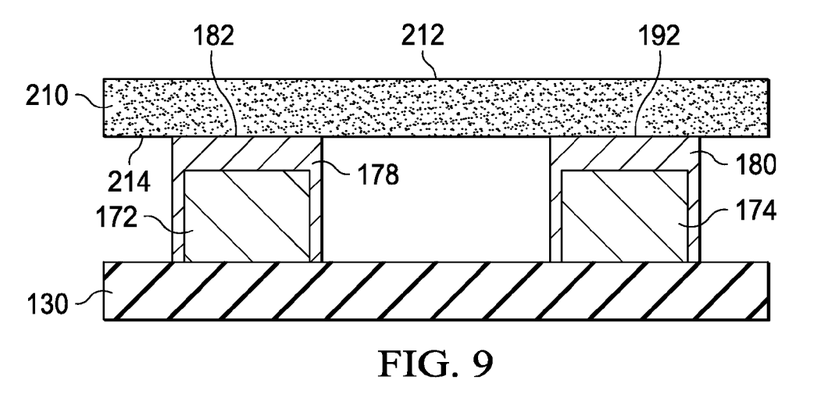
FIG. 9 is a cross-sectional side elevation view of the assembly FIG. 8 after application of a tape player to the plated metal portions thereof.

As illustrated by FIG. 9, a tape 210 having a first smooth/nonadhesive surface 212 and a second tacky/adhesive surface 214. The tape 210 is attached, adhesive surface 214 down, to the top plated surfaces 182, 192 of the leads 172, 174.

Figure 10:
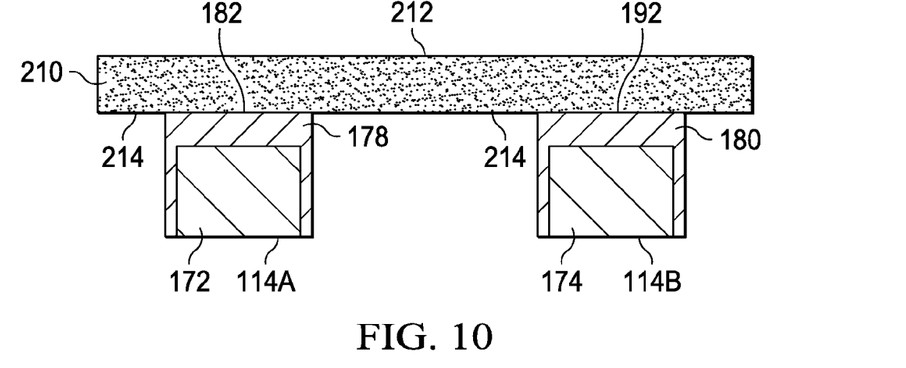

Next, as illustrated in FIG. 10, the dry film layer 130 is removed, leaving surfaces 114A of lead 172 and 114B of the lead 174 exposed.

Figure 11:
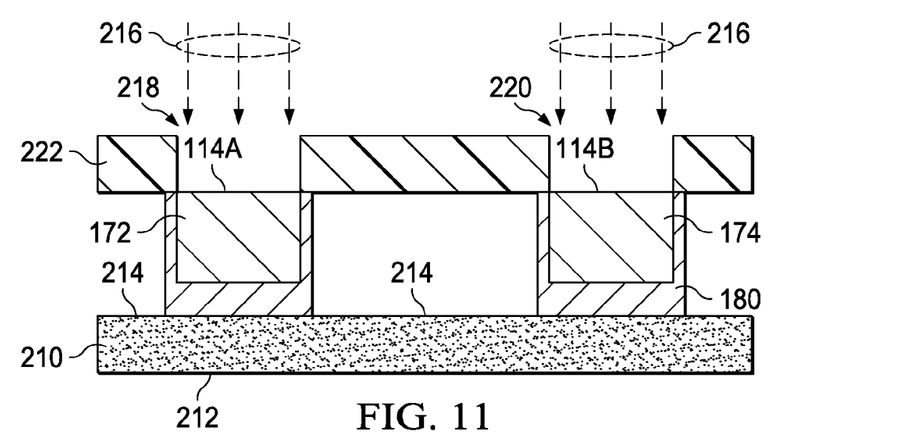
FIG. 11 is a cross-sectional side elevation view of the assembly of FIG. 10 illustrating metal plating of unplated surfaces of two metal portions to form two plated leads.
Figure 12:
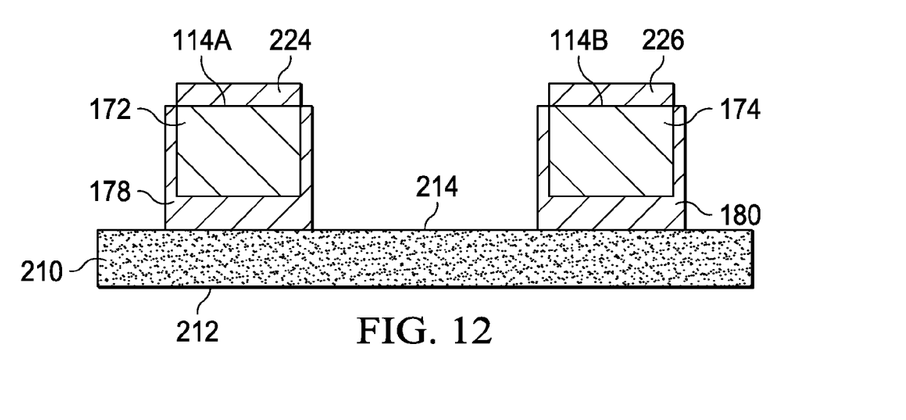
FIG. 12 is a cross-sectional side elevation view of the assembly of FIG. 11 illustrating two plated leads formed by the operation of FIG. 11.

FIG. 11 illustrates the assembly of FIG. 10 in a flipped over position and shows application of a mask 222 to the leads 172, 174. The mask 222 has openings 218 and 220 therein aligned with surfaces 114A and 114B of the leads 172, 174. Plating material 216 is applied through the openings, such that surfaces 114A and 114B are coated with plating layers 224 and 226, respectively, as shown in FIG. 12. The leads 172, 174, thus plated, are now referred to as plated leads 234, 236. This essentially completes the lead formation process.

Figure 13:
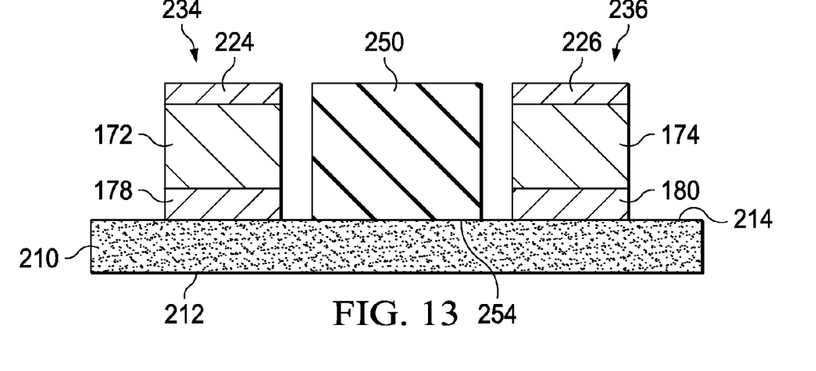
FIG. 13 is a cross-sectional side elevation view of the assembly of FIG. 12 after mounting of a die thereon.
Figure 14:
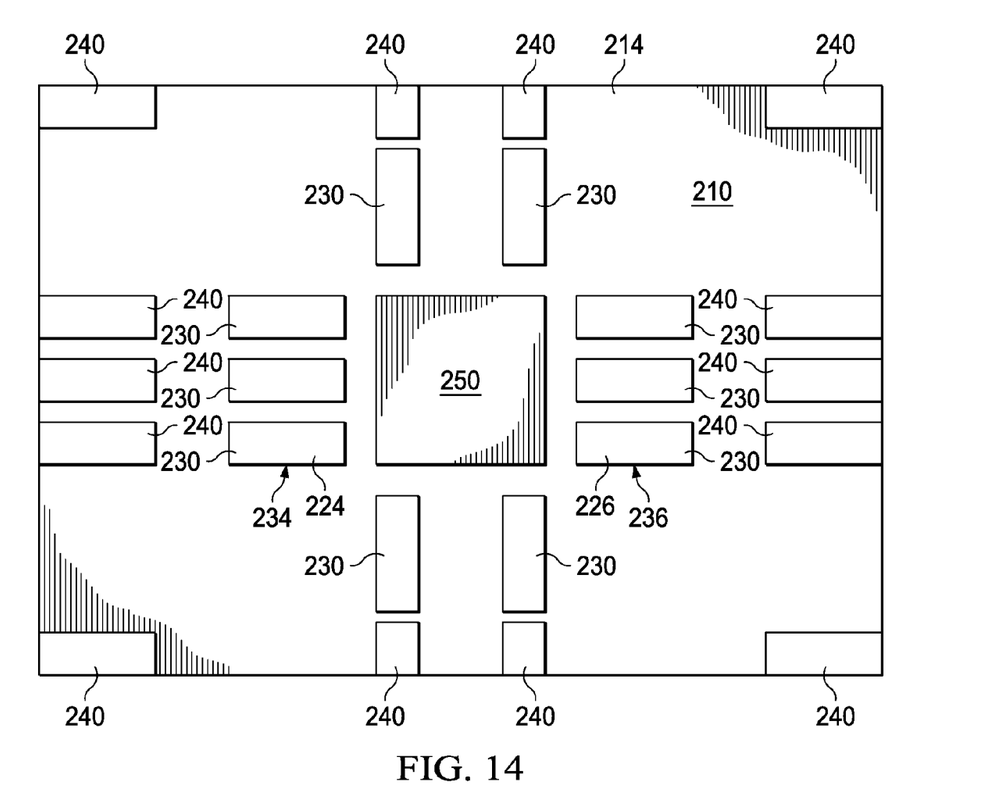
FIG. 14 is an expanded top plan view of the assembly illustrated in FIG. 13 showing additional plated leads.

Next, as illustrated in FIG. 13, an integrated circuit die 250 is mounted on the tape 210 between the plated leads 234, 236. The drawings, to this point have illustrated only a small region of a larger assembly, which comprises a plurality of leadframes. FIG. 14 is a top plan view of a larger portion of this overall assembly. As shown by FIG. 14 the die 250 is positioned at the center of a plurality of surrounding leads designated 230, collectively. In the illustrated embodiment of FIG. 14, only the leads that are directly adjacent to the die 250 form part of the leadframe associated with die 250. In other embodiments other leads positioned outwardly of the leads 230 may be associated with the die 250. In the embodiment of FIG. 14, leads 240 positioned outwardly of the leads 230 are associated with other leadframes which surround other dies that may be identical to die 250.

Figure 15:
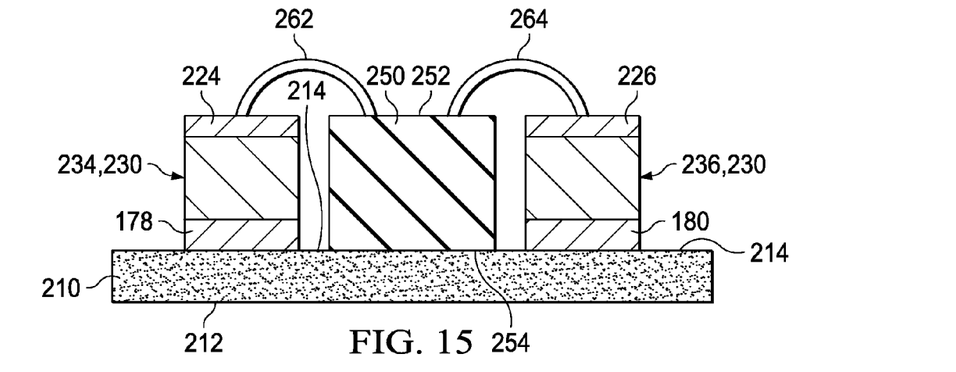
FIG. 15 is a cross-sectional side elevation view of the assembly of FIG. 13 after wire bonding of the die to adjacent plated leads.

FIG. 15, again, illustrates only a portion of the entire leadframe and die assembly being formed. It may be seen from FIG. 15 that the die 250 has an active circuit side 252 positioned upwardly in the drawing, and a backside 254, which is attached to the adhesive surface 214 of tape 210. In FIG. 15, bond wires 262, 264 attach electrical contacts (not shown) on surface 252 of the die 250 to the plated surfaces 224, 226 of plated leads 234, 236, as by use of conventional wire bonding processes.

Figure 16:
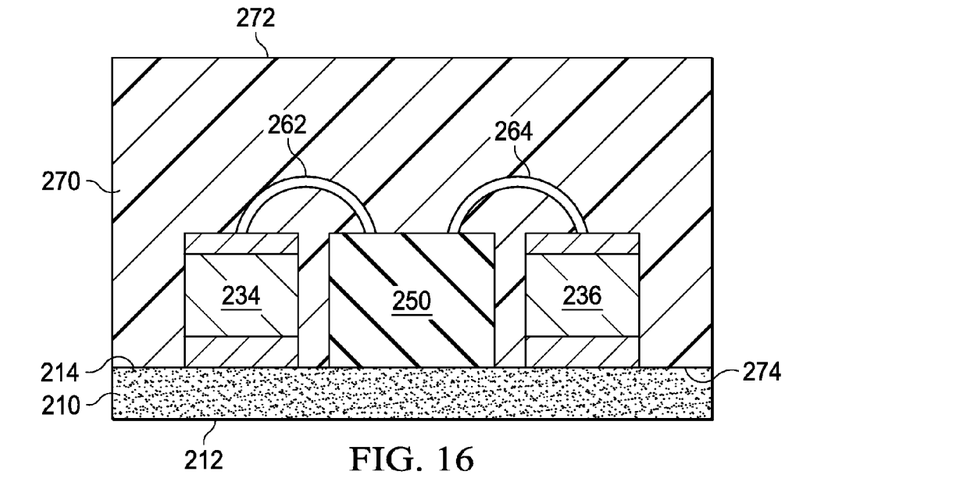
FIG. 16 is a cross-sectional side elevation view of the assembly of FIG. 15 after encapsulation thereof in mold compound.

FIG. 16 is a cross sectional elevation view of the assembly of FIG. 15, after application of a layer of mold compound 270 thereto. Mold compound 270 has a top surface 272 and a bottom surface 274. The bottom surface 274 interfaces with the adhesive side 214 of the tape 210. The mold compound 270 may be applied using conventional processes, such as, for example, through use of a transfer mold.

Figure 17:
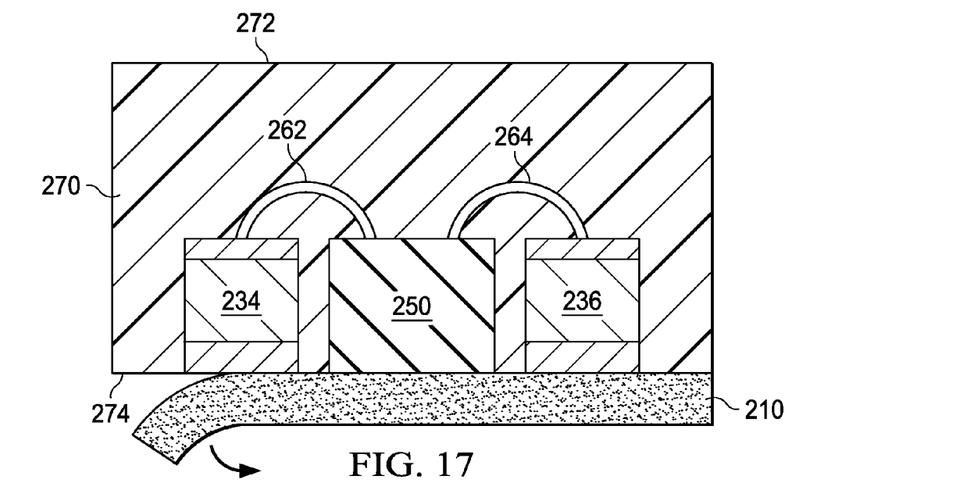
FIG. 17 is a cross-sectional side elevation view of the assembly FIG. 16 showing removal of a second film layer therefrom.
Figure 18:
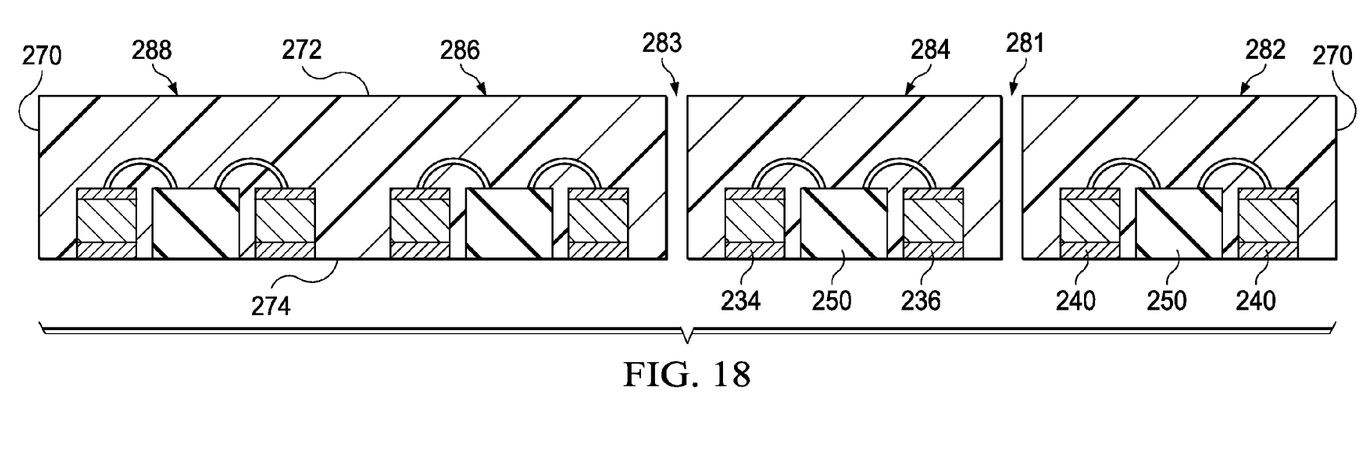
FIG. 18 is a cross-sectional side elevation view of a larger portion of the assembly shown in FIG. 17 after removal of the film layer therefrom and showing dicing cuts made thereto.

FIG. 18 is a side elevation view of a larger portion of the die/lead/mold block assembly shown in FIG. 17 that illustrates singulated portions 282, 284 and as yet unsingulated portions 286, 288, of the assembly, which are being formed into individual integrated circuit packages 282, 284. As discussed in greater detail with respect to FIG. 22, none of the cuts 281, 283 extend through metal.

Figure 19:
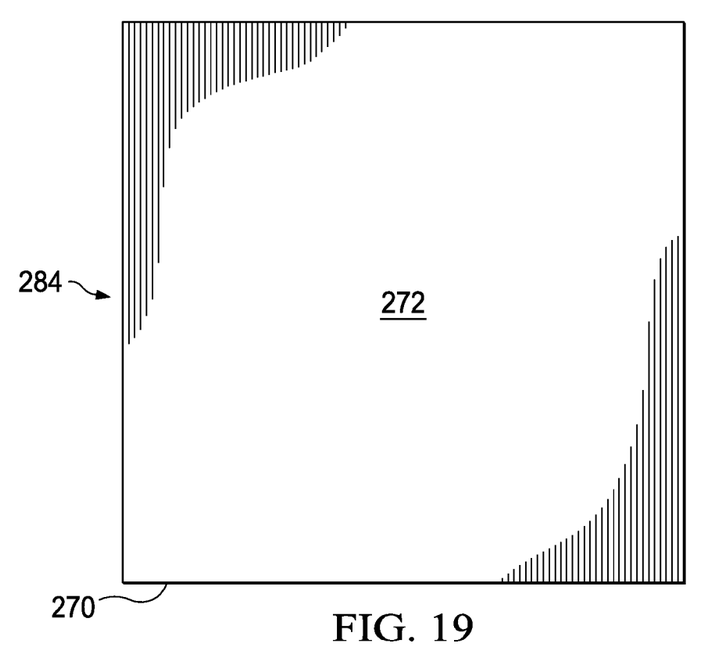
FIG. 19 is a top plan view of one integrated circuit package singulated from the assembly shown in FIG. 18.
Figure 20:
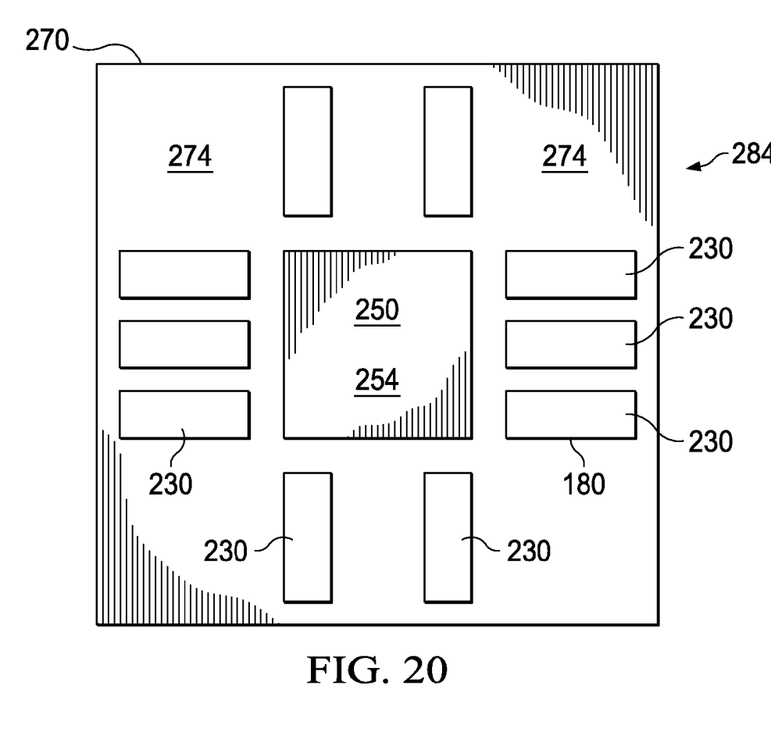
FIG. 20 is a bottom plan view of the integrated circuit package illustrated in FIG. 19.

FIG. 19 is a top plan view and FIG. 20 is a bottom plan view of one integrated circuit package 284 formed by singulating the mold block 270. As illustrated in FIG. 19 no portions of the die 250, leads 230 or bond wires 262, 264, etc., are exposed at the top surface 272. As illustrated in FIG. 20, the bottom surface 254 of the die 250 and the bottom plated portions of the leads 230 are exposed at the bottom surface 274 of the block of mold compound 270.

Figure 22:
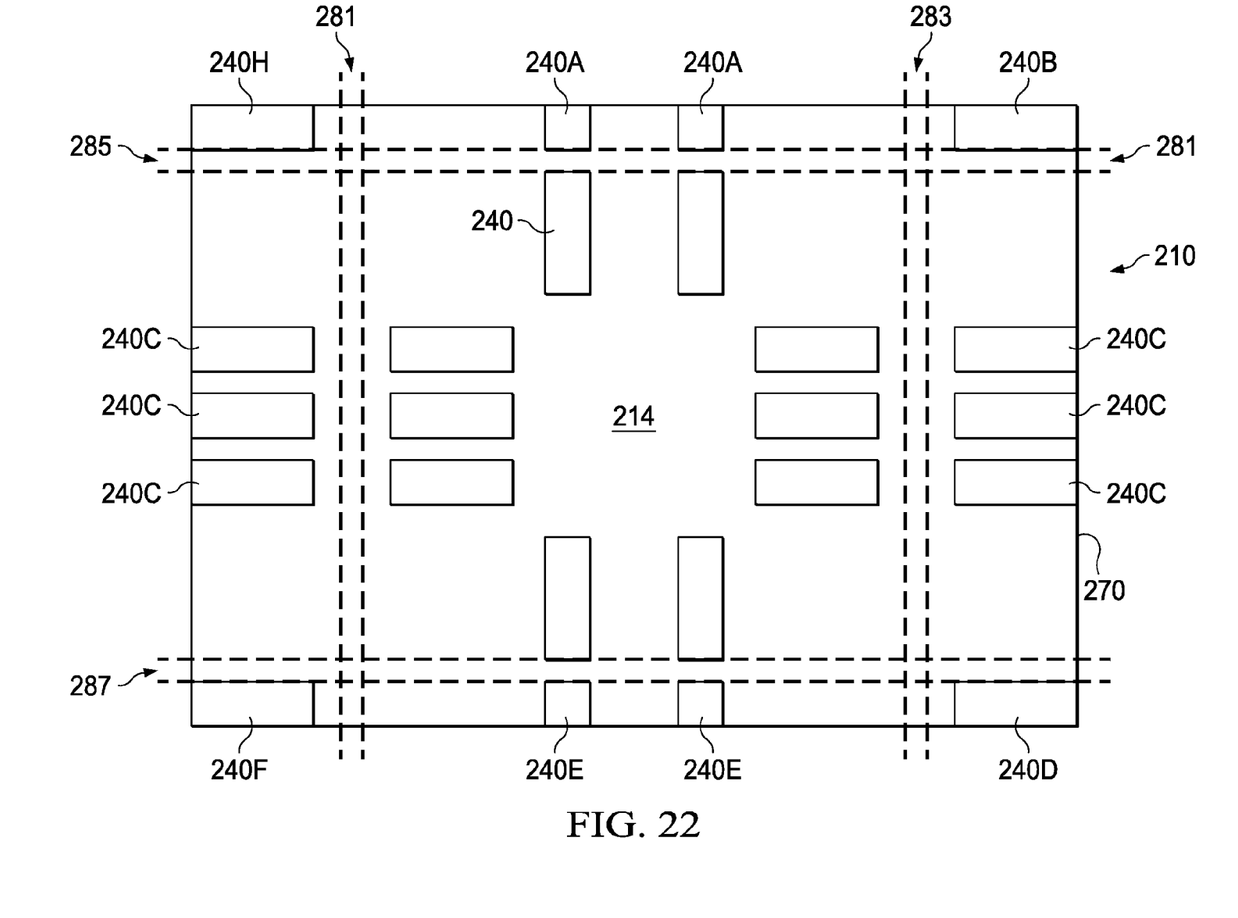
FIG. 22 is a top plan view of a leadframe sheet of the type illustrated in FIG. 14 showing the position of saw streets.

FIG. 22 is a top plan view of a portion of the block of mold compound 270. The mold compound in this view is transparent to show the positions of the die and leads. The portion of the mold compound 270 shown in FIG. 22 corresponds to the portion of the unmolded assembly shown in FIG. 14.

As shown by FIG. 22 the cut lines or "saw streets" 281, 283, 285, 287 do not intersect any of the leads 230, 240, although, in the case of saw streets 285, 287, the saw streets pass close to end portions of the leads 230, 240. Since the saw streets do not pass through any metal, no metal is cut during singulation and therefore no metal burrs are created using applicant's IC forming method.

Figure 21:
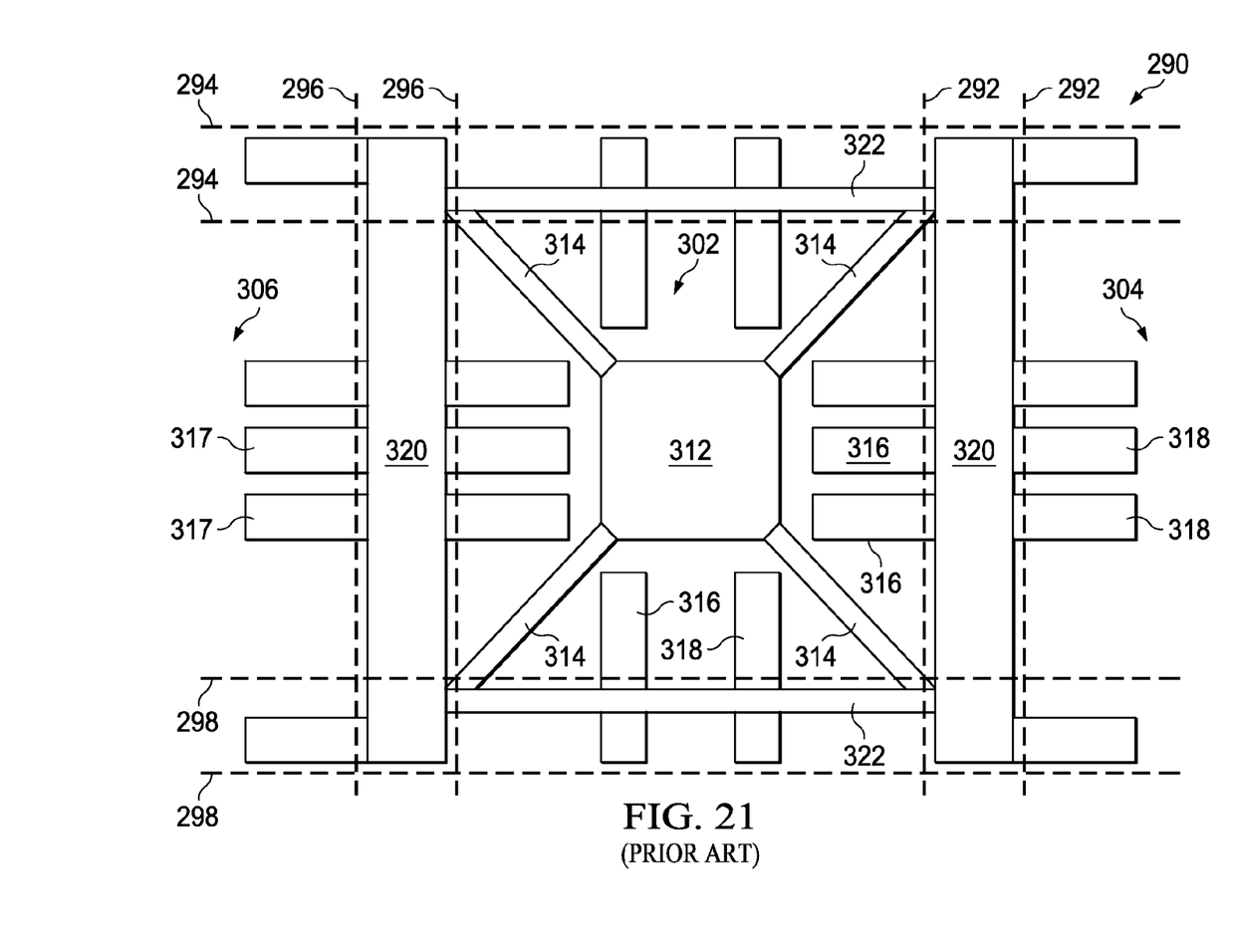
FIG. 21 is a top plan view of a prior art leadframe sheet showing the position of saw streets.

FIG. 21 illustrates saw cutting operations of the prior art. A mold compound encapsulated conventional leadframe sheet 290 (in which the mold compound is transparent for illustrative purposes) is severed along a plurality of saw streets 292, 294, 296, 298 to form a plurality integrated circuits having corresponding leadframes 302, 304, 306, etc. Each leadframe 302, 304, 306, etc., comprises a centrally mounted die pad 312 (only one shown) connected by tie bars 314 to support strips 320, 322. Each leadframe also comprises a plurality of leads 317, 316, 318, etc. The saw streets 292, 294, 296, 298 extend through end portions of the leads 316, 318 and end portions of the tie bars 314 of each leadframe 302, 304, 306, etc. that is formed. Singulation sawing severs portions of each lead 316, often creating metal burrs and copper smearing in the process. Such metal burrs and copper smears are undesirable because they may cause shorting of adjacent leads, as well as producing other surface mount (SMT) issues. Also, a considerable amount of scrap, associated with the support strips 320, 322 and tie bars 314, is produced by this prior art process. Metal sawing also dulls saw blades more quickly than sawing through mold compound. Thus, sawing operations must be stopped for saw blade replacement much more often during prior art sawing operations than in the sawing operations shown in FIG. 22. Replacement of saw blades adds to the overall expense of QFN and similar semiconductor package fabrication processes.

In QFNs formed as shown in FIG. 21, a die (not shown) is attached to the die pad 312 by an adhesive compound or solder. In either case, heat escaping from the bottom surface of the die must pass through both this attachment layer and the die pad 312. In the integrated circuit packages formed as shown in FIGS. 1-20, the die 250 is supported within the QFN or related integrated circuit package 284 without a die pad. Thus heat from the die 250 is dissipated more efficiently than in the prior art embodiments, such as shown in FIG. 21, because there is nothing positioned between the die backside surface 254 and a printed circuit board (not shown), or the like, on which the die 250 is mounted.

Figure 23:
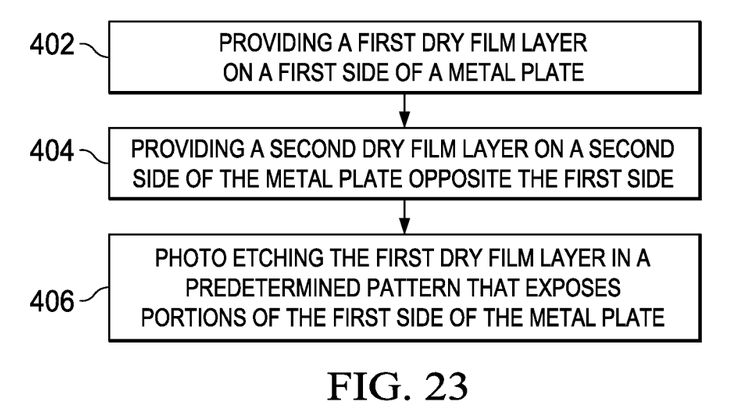
FIG. 23 is a flow chart of an example embodiment of a method of making a plated leadframe.

As shown by FIG. 23, a method of making a plated leadframe may include, as shown at block 402, providing a first dry film layer on a first side of a metal plate. The method may also include, as shown at block 404 providing a second dry film layer on a second side of the metal plate opposite the first side. The method may further include, as shown at block 406, photo etching the first dry film layer in a predetermined pattern that exposes portions of the first side of the metal plate.

Figure 24:
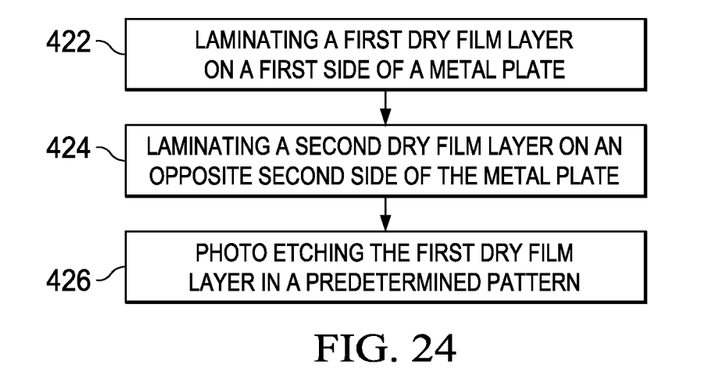
FIG. 24 is a flowchart of an example embodiment of a method of making a plurality of QFN's.

As shown by FIG. 24, a method of making a plurality of integrated circuit packages may include, as shown at block 422, laminating a first dry film layer on a first side of a metal plate. The method may also include as shown at block 424, laminating a second dry film layer on an opposite second side of the metal plate and, as shown at block 426 photo etching the first dry film layer in a predetermined pattern.

Figure 25:
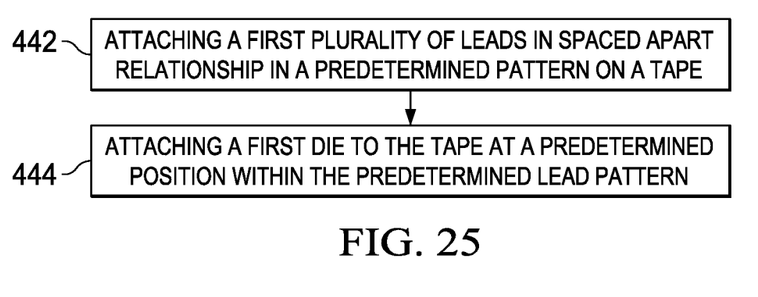
FIG. 25 is a flowchart of an example embodiment of a method of making a flat no lead package.

As shown by FIG. 25, a method of making a flat no lead package may include, as shown at block 442, attaching a first plurality of leads in spaced apart relationship in a predetermined pattern on a tape and, as shown at block 444, attaching a first die to the tape at a predetermined position within the predetermined lead pattern.

Although embodiments of certain example embodiments of methods of making integrated circuit packages and associated leadframes and example embodiments of integrated circuit package devices have been described herein in detail, alternative embodiments of such methods and devices will become obvious to those skilled in the art after reading this disclosure. The language of the appended claims is intended to be broadly construed to cover such alternative embodiments, except as limited by the prior art.

What is claimed is:

1. A method of making a plated leadframe comprising:
   providing a first film layer on a first side of a metal plate;
   providing a second film layer on a second side of the metal plate opposite the first side;
   photo etching the first film layer in a predetermined pattern that exposes portions of the first side of the metal plate;
   chemical etching the exposed portions of the first side of the metal plate to produce a plurality of leads;
   removing the first film layer from the plurality of leads;
   plating first side surfaces of the plurality of leads;
   applying an adhesive tape to the plated first side surfaces of the plurality of leads;
   removing the second film layer from the second side surface of the plurality of leads;
   masking the second side surfaces of the plurality of leads; and
   plating the second side surfaces of the plurality of leads.

2. A method of making a plurality of integrated circuit packages comprising:
   laminating a first film layer on a first side of a metal plate;
   laminating a second film layer on an opposite second side of the metal plate;
   photo etching the first film layer in a predetermined pattern;
   chemical etching the exposed portions of the metal plate exposed by the photo etching to produce a plurality of leads arranged in a predetermined leadframe patterns;
   removing the first film layer from the plurality of leads;
   plating the first side surfaces of the plurality of leads;
   applying an adhesive tape to the plated first side surfaces of the plurality of leads;
   removing the second film layer from the second side surfaces of the plurality of leads;
   plating the second side surfaces of the plurality of leads;
   placing a plurality of dies on the adhesive tape at predetermined positions with respect to the plurality of leads in the predetermined leadframe patterns;
   wire bonding each die to a predetermined set of leads in each leadframe pattern;
   encapsulating the wire bonded dies and the plurality of leads in mold compound to form an encapsulant block; and
   cutting the encapsulated block into a plurality of portions corresponding to integrated circuit packages, wherein said cutting does not comprise cutting metal.

3. A method of making a plurality of integrated circuit packages comprising:
   laminating a first film layer on a first side of a metal plate;
   laminating a second film layer on an opposite second side of the metal plate;
   photo etching the first film layer in a predetermined pattern;
   chemical etching the exposed portions of the metal plate exposed by the photo etching to produce a plurality of leads arranged in a predetermined leadframe patterns;
   removing the first film layer from the plurality of leads;
   plating the first side surfaces of the plurality of leads;
   applying an adhesive tape to the plated first side surfaces of the plurality of leads;
   removing the second film layer from the second side surfaces of the plurality of leads;
   plating the second side surfaces of the plurality of leads;
   placing a plurality of dies on the adhesive tape at predetermined positions with respect to the plurality of leads in the predetermined leadframe patterns;
   wire bonding each die to a predetermined set of leads in each leadframe pattern;
   encapsulating the wire bonded dies and the plurality of leads in mold compound to form an encapsulant block; and
   cutting the encapsulated block into a plurality of portions corresponding to integrated circuit packages, wherein said cutting does not comprise cutting the leads.

* * * * *